US010365131B2

(12) United States Patent
Grossman et al.

(10) Patent No.: US 10,365,131 B2
(45) Date of Patent: Jul. 30, 2019

(54) HYBRID INERTIAL MEASUREMENT UNIT

(71) Applicant: Honeywell International Inc., Morris Plains, NJ (US)

(72) Inventors: Owen D. Grossman, Golden Valley, MN (US); Timothy J. Hanson, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 228 days.

(21) Appl. No.: 15/158,267

(22) Filed: May 18, 2016

(65) Prior Publication Data
US 2017/0336228 A1 Nov. 23, 2017

(51) Int. Cl.
G01D 18/00 (2006.01)
G01D 11/10 (2006.01)
G01C 21/16 (2006.01)
G01C 19/04 (2006.01)
G01P 1/02 (2006.01)
G01R 33/00 (2006.01)

(52) U.S. Cl.
CPC ............. G01D 18/00 (2013.01); G01C 21/16 (2013.01); G01D 11/10 (2013.01); G01C 19/04 (2013.01); G01P 1/023 (2013.01); G01R 33/0076 (2013.01)

(58) Field of Classification Search
CPC ......... G01D 18/00; G01D 11/10; G01C 19/04
See application file for complete search history.

(56) References Cited

U.S. PATENT DOCUMENTS 7,747,409 B2    6/2010  Ladetto et al.
8,762,091 B1 *  6/2014  Foxlin .................... G01P 15/00
                                                            702/87
8,898,013 B2   11/2014  Napolitano
(Continued)

FOREIGN PATENT DOCUMENTS

EP              2629053         8/2013

OTHER PUBLICATIONS

European Patent Office, "Extended European Search Report from EP Application No. 17167170.4, dated Sep. 28, 2017", "from Foreign Counterpart of U.S. Appl. No. 15/158,267", Sep. 28, 2017, pp. 1-9, Published in: EP.

(Continued)

Primary Examiner — Mohamed Charioui
(74) Attorney, Agent, or Firm — Fogg & Powers LLC

(57) ABSTRACT

A hybrid inertial measurement unit (IMU) comprises: a low frequency (LF) sensor providing a first signal containing information for a first parameter of the hybrid IMU; a shock resistant (SR) sensor providing a second signal containing information for the first parameter, wherein the SR sensor is resistant to destabilization during a destabilizing operational period; and a processor, wherein the processor further comprises: a weighting factor computation module to compute a weight to be applied to the first signal and to compute a weight to be applied to the second signal; a LF weighting module to apply the computed weight to the first signal to create a weighted first signal; a SR weighting module to apply the computed weight to the second signal to create a weighted second signal; and a compensator to combine the weighted first signal and the weighted second signal to create a compensated signal containing information for the first parameter.

20 Claims, 4 Drawing Sheets

(56) References Cited

U.S. PATENT DOCUMENTS

| | | | | |
|---|---|---|---|---|
| 2006/0253253 | A1 | 11/2006 | Reynolds et al. | |
| 2010/0324822 | A1* | 12/2010 | Coatantiec | G01S 19/20 |
| | | | | 701/472 |
| 2012/0296567 | A1* | 11/2012 | Breed | G01C 21/26 |
| | | | | 701/468 |
| 2014/0343460 | A1 | 11/2014 | Evans, III et al. | |
| 2016/0047675 | A1* | 2/2016 | Tanenhaus | G01C 25/005 |
| | | | | 702/104 |

OTHER PUBLICATIONS

European Patent Office; "Communication pursuant to Article 94(3) EPC from EP Application No. 17167170.4 dated Jun. 4, 2018"; from Foreign Counterpart of U.S. Appl. No. 15/158,267; pp. 1-5; Dated Jun. 4, 2018; Published: EP.

* cited by examiner

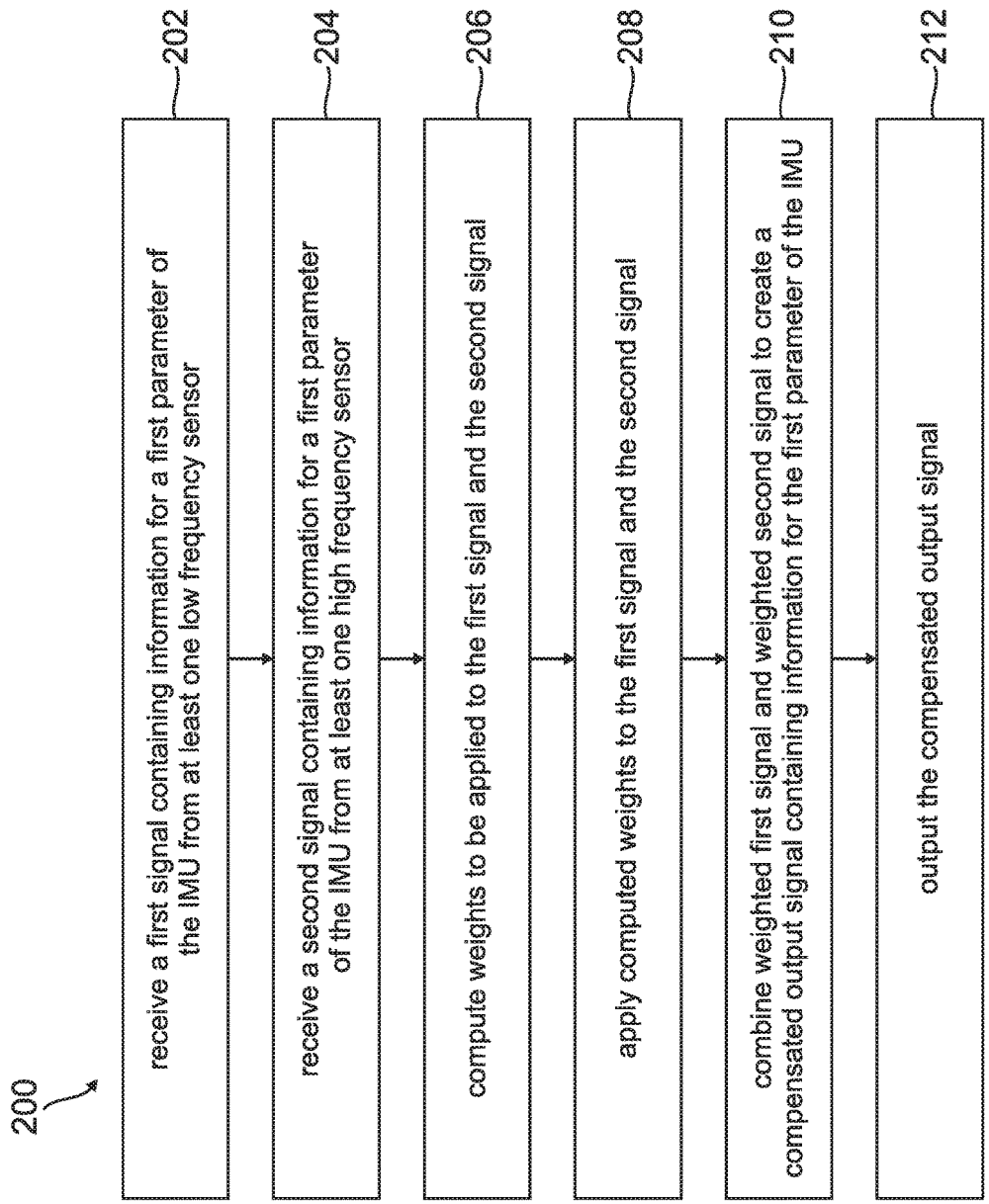

HYBRID INERTIAL MEASUREMENT UNIT

BACKGROUND

Typically, a larger microelectromechanical systems (MEMS) sensor will have better overall performance but greater susceptibility to shock and vibration. Similarly, its larger mass will generally require longer start-up times, particularly for MEMS gyros. Thus, high performance MEMS sensors can often exhibit degraded performance when exposed to the severe shock and vibration and exhibit relatively slow start-up times. This makes it difficult for MEMS technology to meet the mission requirements for certain missile or other harsh environment and/or very fast start-time applications.

SUMMARY

A hybrid inertial measurement unit (IMU) is provided. The hybrid IMU comprises: at least one low frequency sensor providing at least a first signal containing information for a first parameter of the hybrid IMU; at least one shock resistant sensor providing at least a second signal containing information for the first parameter of the hybrid IMU, wherein the at least one shock resistant sensor is resistant to destabilization during a destabilizing operational period; and at least one processor, wherein the at least one processor further comprises: a weighting factor computation module to compute a weight to be applied to the at least the first signal and to compute a weight to be applied to the at least the second signal; a low frequency weighting module to apply the computed weight to the at least the first signal to create a weighted first signal; a shock resistant weighting module to apply the computed weight to the at least the second signal to create a weighted second signal; and a compensator to combine the weighted first signal and the weighted second signal to create a compensated signal containing information for the first parameter of the hybrid IMU, and to output the compensated signal containing information for the first parameter of the hybrid IMU.

DRAWINGS

Understanding that the drawings depict only exemplary embodiments and are not therefore to be considered limiting in scope, the exemplary embodiments will be described with additional specificity and detail through the use of the accompanying drawings, in which:

FIG. 2 is a flow diagram showing an exemplary method used for providing measurements in a hybrid inertial measurement unit according to one embodiment of the present disclosure.

Figure 1:
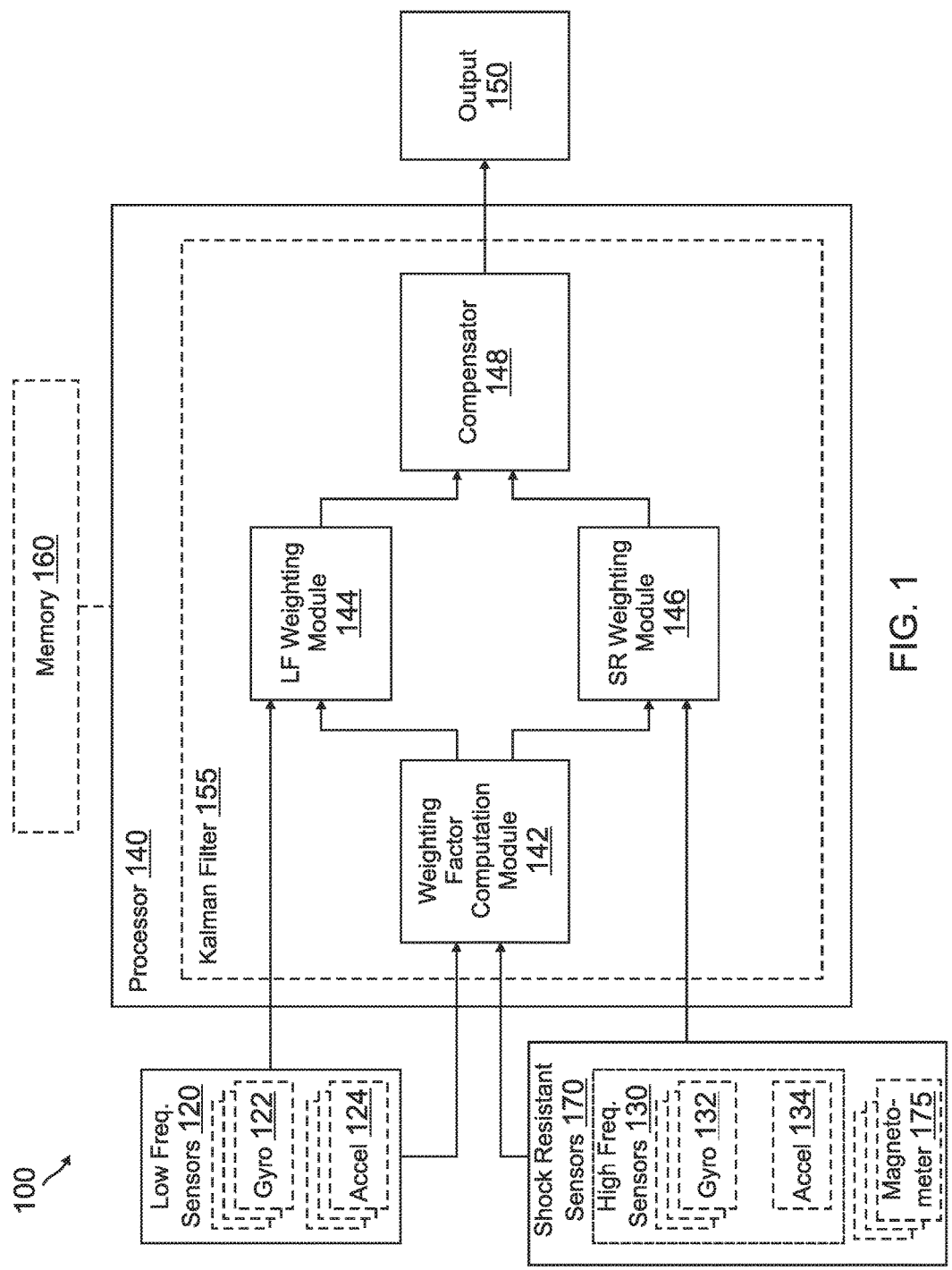
FIG. 1 is an exemplary embodiment of a hybrid inertial measurement unit according to one embodiment of the present disclosure.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Inertial Measurement Units (IMU) typically include sensors (such as accelerometers, gyroscope, etc.) to measure various parameters such as the rate of acceleration and rotational attributes of a body. The sensors operate within a given range of mechanical frequencies presenting a vulnerability such that when sufficient external energy is input to the sensor at those frequencies, the function of the sensor may be compromised. The vulnerable frequencies of the sensor are directly related to the physical size of the sensor.

Shock and vibration events may create interference in the accuracy of the data output by these sensors, especially in large sensors, which perform at a low frequency. While the event may last for a small fraction of a second, the effects of the event on the large sensor can last for a substantial duration of time after the event. Because these large sensors perform at a low frequency and can often be larger in scale, the recovery time of these large sensors after a shock and vibration event is slow. In applications such as platform projectiles that travel at hundreds of miles per hour, one second can cover a lot of distance and poor performance of the large sensor for as much as a second can cause substantial error in the measurements of the sensor. The large sensors are also described as "low frequency sensors" in the embodiments described herein.

Smaller sensors, which typically perform at a higher frequency react faster than the large sensors and are less affected by outside influences. Because smaller sensors have a higher frequency and can react faster than large sensors, after a shock and vibration event, smaller sensors are likely to achieve its full stability in a shorter time duration as compared to large sensors. For example, in some applications, large sensors may take a second or more to achieve full stability whereas small sensors can reach full stability in tenths of a second. The smaller sensors are also described as "high frequency sensors" or "shock resistant sensors" in the embodiments described herein.

The embodiments described below integrate a set of low frequency sensors along with a set of shock resistant sensors that may include high frequency sensors. Because the low frequency sensors are more accurate once they reach full stability, low frequency sensors would provide high performance overall while the shock resistant sensors provide improved performance during shock and vibration events, as well as fast start-up characteristics. In exemplary embodiments, the low frequency sensors are larger than the shock resistant sensors. The combination of sensors provides for a range of mechanical frequencies and building an inertial measurement unit (IMU) with multiple sizes of sensors increasing the odds that during operational periods that can destabilize one or more sensors, such as during shock and vibration events and shortly after start-up, at least one of the group of sensors will continue to operate without disruption.

FIG. 1 shows an example of a hybrid inertial measurement unit (IMU) 100 as implemented in the embodiments described herein. IMU 100 includes at least one set of low frequency sensors 120, at least one set of shock resistant sensors 170 and a processor 140. The low frequency sensors 120 and the shock resistant sensors 170 measure various parameters such as rate of acceleration and rotational attributes of a body. In exemplary embodiments, the low frequency sensors 120 and the shock resistant sensors 170 are microelectromechanical systems (MEMS) sensors. In exemplary embodiments, the shock resistant sensors 170 include high frequency sensors 130. In exemplary embodiments, the set of shock resistant sensors 170 include at least one magnetometer 175. Typically, a magnetometer provides measurements for the magnetic field surrounding a body. In the exemplary embodiments described herein, magnetometer 175 provides measurements for the magnetic field surrounding a body comprising the hybrid IMU, the measurements indicative of one or more parameters (such as the rate of acceleration and rotational attributes of the body). The signals from low frequency sensors 120 and shock resistant sensors 170 are received by processor 140. Processor 140 is configured to weigh the signals received from low frequency sensors 120 and shock resistant sensors 170 in creating an output 150 for IMU 100.

In exemplary embodiments, the set of low frequency sensors 120 include at least one gyroscope 122. In exemplary embodiments, the set of low frequency sensors 120 include at least one accelerometer 124. In exemplary embodiments, the set of low frequency sensors 120 includes six MEMS sensors (see for example, FIG. 1B). In one such example, the six MEMS sensors include three gyroscopes and three accelerometers (see for example, FIG. 1B). In exemplary embodiments, the set of low frequency sensors 120 may include one or more magnetometers.

In exemplary embodiments, the shock resistant sensors 170 include high frequency sensors 130. In exemplary embodiments, the set of high frequency sensors 130 include at least one gyroscope 132. In exemplary embodiments, the set of high frequency sensors 130 include at least one accelerometer 134. In exemplary embodiments, the set of high frequency sensors 130 includes six MEMS sensors. In one such example, the six MEMS sensors include three gyroscopes 132 and three accelerometers 134. In exemplary embodiments, high frequency sensors 130 are physically smaller than low frequency sensors 120. In exemplary embodiments, the set of shock resistant sensors 170 include at least one magnetometer 175.

The low frequency sensors 120 and the shock resistant sensors 170 are operated at the same time, and the signals from the low frequency sensors 120 and the shock resistant sensors 170 are received by the processor 140 included in IMU 100. Processor 140 is configured to monitor the signals generated by the low frequency sensors 120 and the shock resistant sensors 170. Based on the information output in these signals, processor 140 is configured to determine when the IMU 100 is in a start-up process or experiencing a shock or vibration event.

Low frequency sensors 120, overall, provide more precise and accurate data compared to shock resistant sensors 170 after both the sets of sensors 120 and 170 have reached full stability. However, after start-up, low frequency sensors 120 take longer to reach full stability than shock resistant sensors 170. Thus, shortly after start-up and before the low frequency sensors 120 have reached full stability, the shock resistant sensors 170 provide more accurate data.

Similarly, shock or vibration events also affect the performance of low frequency sensors 120 and shock resistant sensors 170. The shock resistant sensors 170 react faster and are less affected by external influences.

In embodiments where the shock resistant sensors 170 include high frequency sensors 130, the high frequency sensors 130 are able to reach full stability faster than the low frequency sensors 120 because the high frequency sensors 130 operate within a higher frequency range compared to the low frequency sensors 120. On the contrary, low frequency sensors 120 take longer to reach full stability after a shock or vibration event has occurred. Thus, shortly after a shock or vibration event and before the low frequency sensors 120 have reached full stability, the shock resistant sensors 170 provide more accurate data.

Low frequency sensors 120 and shock resistant sensors 170 output signals containing information regarding one or more parameters of the IMU 100 measured by the low frequency sensors 120 and shock resistant sensors 170. The signals output from the low frequency sensors 120 and shock resistant sensors 170 are received by a processor 140. Processor 140 includes or functions with software programs, firmware or other computer readable instructions for carrying out various methods, process tasks, calculations, and control functions, used in the operation of the exemplary embodiments of the IMU 100 described herein.

These instructions are typically stored on any appropriate computer readable medium used for storage of computer readable instructions or data structures. The computer readable medium can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

Processor 140 is configured to monitor the information in the signals output from the low frequency sensors 120 and the shock resistant sensors 170. Based on the information in the signals output from the low frequency sensors 120 and shock resistant sensors 170, processor 140 determines when a shock or vibration event occurs.

Processor 140 further includes a weighting factor computation module 142. Weighting factor computation module 142 receives signals from low frequency sensors 120 and shock resistant sensors 170 and determines the weighting to be applied to each signal received based on the information output in the signals. Weighting factor computation module 142 performs a continuous assessment of which sensors provide the most accurate information.

Because the shock resistant sensors 170 are less affected by external influences such as shock and vibration events, when processor 140 determines that a shock or vibration event occurs, weighting factor computation module 142 provides greater weighting to signals output from shock resistant sensors 170 than the weighting applied to signals output from low frequency sensors 120 during the shock event and for a selected period of time following the shock event. Similarly, because low frequency sensors 120 take longer to reach full stability than shock resistant sensors 170 after start-up, for a short time duration after sensors 120 and 170 are started, weighting factor computation module 142 provides greater weighting to signals output from shock resistant sensors 170 compared to the weighting applied to signals output from low frequency sensors 120 during start-up and for a selected period of time after start-up.

As the operational periods that can destabilize the operation of one or more sensors (such as the shock and vibration event and/or time duration after start-up) passes, the low frequency sensors 120 start regaining stability and the weighting factor computation module 142 increases the weighting to be applied to the low frequency sensors 120 based on the level of stability of the low frequency sensors 120 as determined from the signals output by low frequency sensors 120. After the low frequency sensors 120 have reached full stability, weighting factor computation module 142 provides a greater weighting to signals output from low frequency sensors 120 than shock resistant sensors 170.

Processor 140 further includes low frequency weighting module 144. The appropriate weighting factor computed by weighting factor computation module 142 for low frequency sensors 120 is received by low frequency weighting module 144. Low frequency weighting module 144 also receives signals output from low frequency sensors 120. Low frequency weighting module 144 applies the appropriate weight calculated by the weighting factor computation module 142 based on the information in the signals output by low frequency sensors 120 and shock resistant sensors 170. In an exemplary embodiment, processor 140 includes or is coupled with a memory, such as memory 160, that stores the signals output from the low frequency sensors 120 for a given time delay during which the weighting factor computation module 142 determines the appropriate weight for each signal received from the low frequency sensors 120.

Similarly, processor 140 further includes a shock resistant weighting module 146. The appropriate weighting factor computed by weighting factor computation module 142 for shock resistant sensors 170 is received by shock resistant weighting module 146. Shock resistant weighting module 146 also receives signals output from shock resistant sensors 170. Shock resistant weighting module 146 applies the appropriate weight calculated by the weighting factor computation module 142 based on the information in the signals output by low frequency sensors 120 and shock resistant sensors 170. In an exemplary embodiment, processor 140 includes or is coupled with a memory 160 that stores the signals output from the shock resistant sensors 170 for a given time delay during which the weighting factor computation module 142 determines the appropriate weight for each signal received from the shock resistant sensors 170.

The weighted signals output from the low frequency weighting module 144 and shock resistant weighting module 146 are received by compensator 148 included in processor 140. The compensator 148 compensates the inertial sensor data by combining the weighted signals output from the low frequency weighting module 144 and shock resistant weighting module and 146 and outputs a single signal 150 for each of the parameters measured by the low frequency sensors 120 and shock resistant sensor 170. In exemplary embodiments, compensator output 150 is a digital stream of information. In exemplary embodiments, compensator output 150 is received by a flight computer.

Figure 1B:
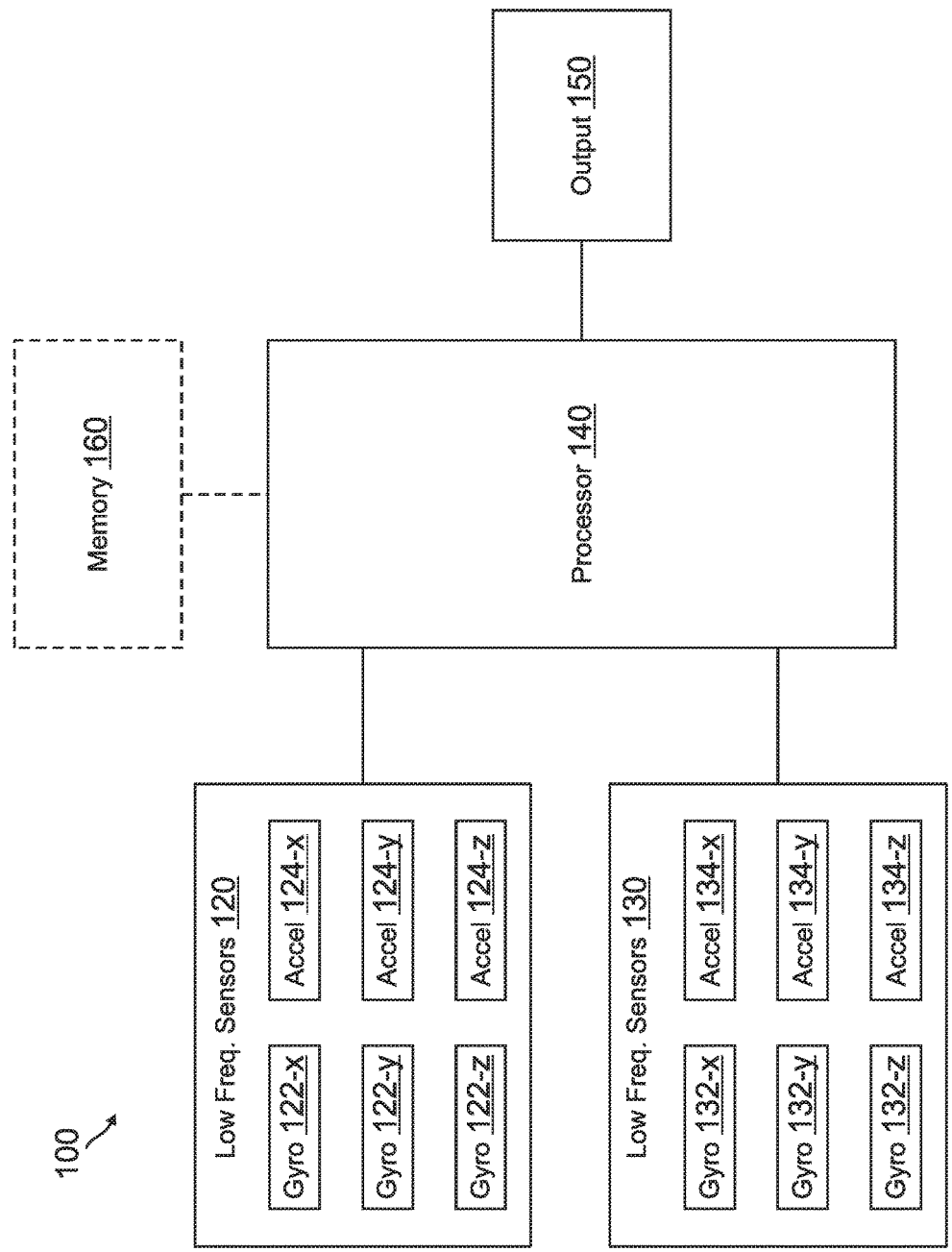
FIG. 1B is an exemplary embodiment of a hybrid inertial measurement according to one embodiment of the present disclosure.

In one example of this embodiment, the set of low frequency sensors 120 includes at least three gyroscopes 122-$x$, 122-$y$, and 122-$z$ (for example, as shown in FIG. 1B) to measure the rotation of IMU 100. Each of the three gyroscopes 122-$x$, 122-$y$ and 122-$z$ measures the rotation of IMU 100 about one of three axes x, y and z. In such an example, the shock resistant sensors 170 include a set of high frequency sensors 130. In one such embodiment, the set of high frequency sensors 130 also includes at least three gyroscopes 132-$x$, 132-$y$ and 132-$z$ (for example, as shown in FIG. 1B) to measure the rotation of IMU 100 about one of three axes x, y and z.

In one example of this embodiment, the set of low frequency sensors 120 includes at least three accelerometers 124-$x$, 124-$y$ and 124-$z$ (for example, as shown in FIG. 1B) to measure the change in speed of the body comprising IMU 100. Each of the three accelerometers 124-$x$, 124-$y$ and 124-$z$ measure the speed changing in one of the three directions along the axes x, y and z. In such an example, the set of high frequency sensors 130 also includes at least three accelerometers 134-$x$, 134-$y$ and 134-$z$ (for example, as shown in FIG. 1B) to measure the change in speed of the body comprising IMU 100 in one of the three directions along the axes x, y and z.

In one example of this embodiment, the weighting factor computation module 142 provides an appropriate weight for all six sensors (three gyroscopes and three accelerometers) in each set of sensors 120 and 130. In such an example, the low frequency weighting module 144 applies the appropriate weight computed by weighting factor computation module 142 to signals output from gyroscopes 122 and accelerometers 124, and the weighted signals are received by compensator 148. In this example, the shock resistant weighting module 146 applies the appropriate weight computed by weighting factor computation module 142 to signals output from gyroscopes 132 and accelerometers 134, and the weighted signals are received by compensator 148. Compensator 148 compensates for the inertial sensor data by combining the weighted signal of a low frequency sensor with the weighted signal of a respective high frequency sensor, wherein both the weighted signals correspond to the same parameter. For example, compensator 148 combines the weighted signal of gyroscope 122-$x$ with the weighted signal of gyroscope 132-$x$ to output a single signal containing optimum measurement of rotation of IMU 100 about the x-axis. Similarly, compensator 148 provides optimum measurement of rotation of IMU 100 about the y-axis based on weighted signals from gyroscopes 122-$y$ and 132-$y$, and optimum measurement of rotation of IMU 100 about the z-axis based on weighted signals from gyroscope 122-$z$ and 132-$z$. Thus, in such an example, compensator 148 would output six measurements, three measurements indicating rotation of IMU 100 about three axes based on combination of the six gyroscopes 122 and 132 and three measurements indicating the change in speed of IMU 100 in three directions about the axes based on combination of six accelerometers 124 and 134.

In exemplary embodiments, the low frequency sensors 120 and the high frequency sensors 130 include support electronics such as front-end electronics, analog-to-digital converters, etc. In exemplary embodiments, the high frequency sensors 130 are off-the-shelf, system-in-package sensors. Weighting factor computation module 142, low frequency weighting module 144, shock resistant weighting module 146 and compensator 148 included in processor 140 may be implemented as software code. In exemplary embodiments, processor 140 includes a Kalman filter 155 that performs the function of one or more of weighting factor computation module 142, low frequency weighting module 144, shock resistant weighting module 146 and compensator 148.

FIG. 2 is a flow diagram showing an exemplary method 200 of providing measurements using a hybrid inertial measurement unit (IMU). As discussed herein, method 200 is described with respect to examples of hybrid IMU, such as IMU 100, shown in FIG. 1.

Method 200 begins at block 202 with receiving at least a first signal containing information for a first parameter of the IMU from a low frequency sensor, such as low frequency sensor 120. Method 200 proceeds to block 204 with receiving at least a second signal containing information for the first parameter of the IMU from a high frequency sensor, such as high frequency sensor 130. In exemplary embodiments, the first parameter measures rotation of the IMU. In exemplary embodiments, the first parameter measures acceleration of the IMU. In exemplary embodiments, low frequency sensors are larger is size than high frequency sensors.

Method 200 proceeds to block 206 with computing appropriate weights to be applied to the at least the first signal and the at least the second signal. In exemplary embodiments, computing appropriate weights to be applied comprises method 300 shown in FIG. 3.

Figure 3:
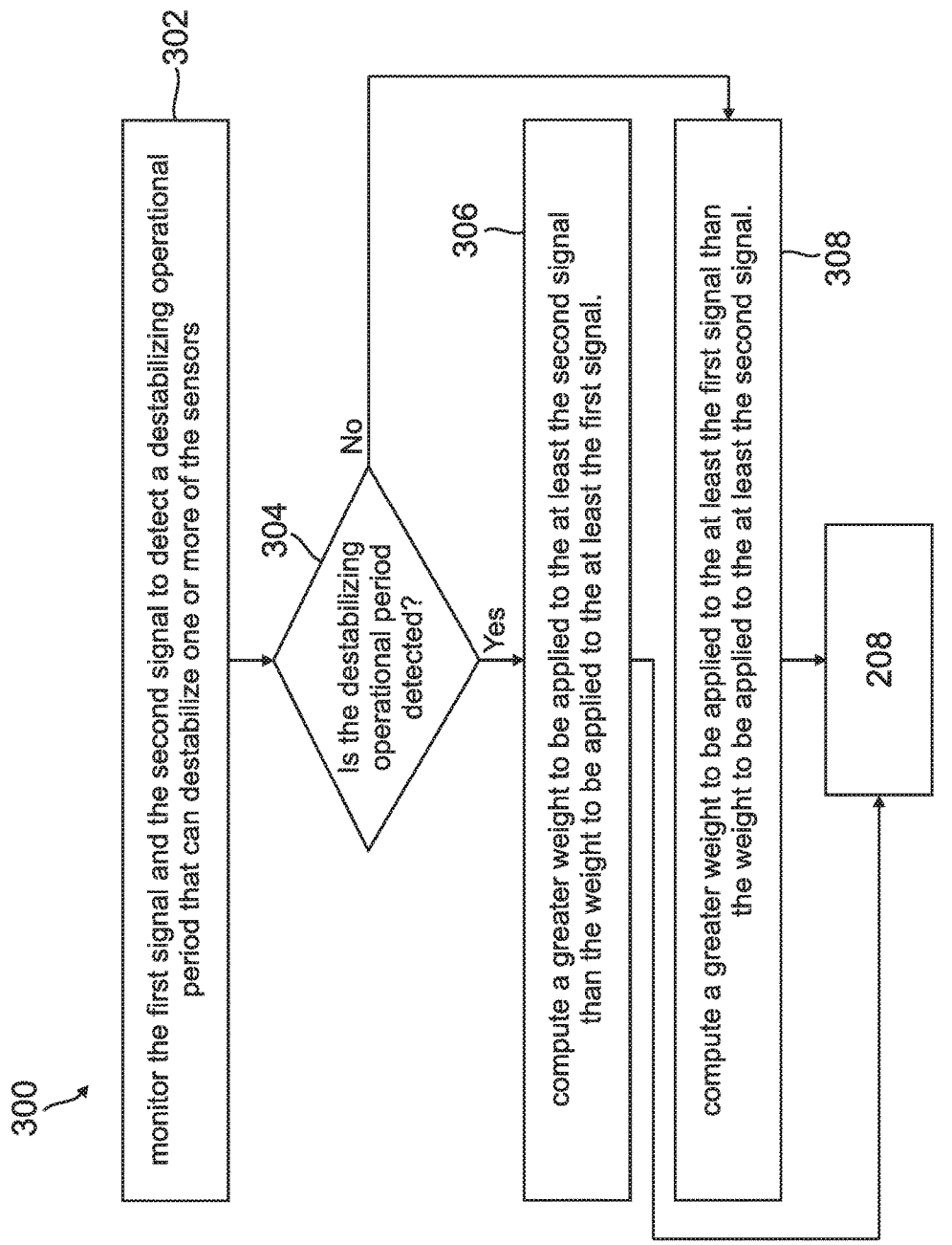
FIG. 3 is a flow diagram showing an exemplary method that may be implemented in the exemplary method shown in FIG. 2 according to one embodiment of the present disclosure.

FIG. 3 is a flow diagram that shows an exemplary method 300 of computing appropriate weights to be applied to the at least the first signal and the at least the second signal. Method 300 begins after receiving the at least the first signal and the at least the second signal. Method 300 begins at block 302 with monitoring the at least the first signal and at least the second signal to detect a destabilizing operational period, during which one or more of the sensors 120 and 130 can be destabilized.

Method 300 proceeds to block 304 with detecting a destabilizing operational period. If a destabilizing operational period is detected, method 300 proceeds to block 306 with computing a greater weight to be applied to the at least the second signal than the weight to be applied to the at least the first signal. If a destabilizing period is not detected, method 300 proceeds to block 308 with computing a greater weight to be applied to the at least the first signal than the weight to be applied to the at least the second signal. After computing appropriate weights to be applied, method 300 proceeds to block 208 of method 200.

As shown in FIG. 2, method 200 proceeds to block 208 with applying the computed weights to the at least the first signal and the at least the second signal to create a weighted first signal and a weighted second signal. In exemplary embodiments, the computed weights are applied using a low frequency weighting module, such as low frequency weighting module 144 and a shock resistant weighting module, such as shock resistant weighting module 146. In such examples, the low frequency weighting module 144 receives signals from low frequency sensors 120 and shock resistant weighting module 146 receives signals from shock resistant sensors 170, and modules 144 and 146 apply appropriate weights to these received signals to output a weight first signal and a weighted second signal.

Method 200 proceeds to block 210 with combining the weighted first signal and the weighted second signal to create a compensated signal containing information for the first parameter of the IMU. In exemplary embodiments, the compensated signal is created using a compensator, such as compensator 148. In exemplary embodiments, the steps in block 206, 208 and 210 are performed using a Kalman filter, such as the Kalman filter 155.

Method 200 proceeds to block 212 with outputting the compensated signal containing information for the first parameter of the IMU. In exemplary embodiments, the outputted compensated signal is at least one of rotation of the IMU about a given axis or change in speed of the IMU in a direction along a given axis.

EXAMPLE EMBODIMENTS

Example 1 includes a hybrid inertial measurement unit (IMU), the hybrid IMU comprising: at least one low frequency sensor providing at least a first signal containing information for a first parameter of the hybrid IMU; at least one shock resistant sensor providing at least a second signal containing information for the first parameter of the hybrid IMU, wherein the at least one shock resistant sensor is resistant to destabilization during a destabilizing operational period; and at least one processor, wherein the at least one processor further comprises: a weighting factor computation module to compute a weight to be applied to the at least the first signal and to compute a weight to be applied to the at least the second signal; a low frequency weighting module to apply the computed weight to the at least the first signal to create a weighted first signal; a shock resistant weighting module to apply the computed weight to the at least the second signal to create a weighted second signal; and a compensator to combine the weighted first signal and the weighted second signal to create a compensated signal containing information for the first parameter of the hybrid IMU, and to output the compensated signal containing information for the first parameter of the hybrid IMU.

Example 2 includes the hybrid IMU of Example 1, wherein the processor is further configured to: monitor signals provided by the at least one low frequency sensor and the at least one shock resistant sensor to detect a destabilizing operational period, wherein during the destabilizing operational period one or more of the at least one low frequency sensors are destabilized; determine when a destabilizing operational period is in process based on information contained in the at least the first signal and the at least the second signal; when the destabilizing operational period is in process, compute a greater weight to be applied to the at least the second signal than the weight to be applied to the at least the first signal; and when the destabilizing operational period is not in process, compute a greater weight to be applied to the at least the first signal than the weight to be applied to the at least the second signal.

Example 3 includes the hybrid IMU of any of Examples 1-2, wherein the destabilizing operational period is at least one of a given time duration after start-up of the hybrid IMU or shock or vibration event.

Example 4 includes the hybrid IMU of any of Examples 1-3, wherein the low frequency sensors are larger in size than the shock resistant sensors.

Example 5 includes the hybrid IMU of any of Examples 1-4, wherein the at least one low frequency sensor includes at least one of a gyroscope, an accelerometer or a magnetometer, and wherein the at least one shock resistant sensor includes at least one of a gyroscope, an accelerometer or a magnetometer.

Example 6 includes the hybrid IMU of any of Examples 1-5, wherein the first parameter is measurement of at least one of the rotation of the hybrid IMU about a given axis or the change in speed of the hybrid IMU in a direction along a given axis.

Example 7 includes the hybrid IMU of any of Examples 1-6, further comprising: a second low frequency sensor providing at least a third signal containing information for a second parameter of the hybrid IMU; a second shock resistant sensor providing at least a fourth signal containing information for the second parameter of the hybrid IMU; and wherein the processor is further configured to: compute a weight to be applied to the at least the third signal; compute a weight to be applied to the at least the fourth signal; apply the computed weight to the at least the third signal to create a weighted third signal; apply the computed weight to the at least the fourth signal to create a weighted fourth signal; combine the weighted third signal and the weighted fourth signal to create a second compensated signal containing information for the second parameter of the hybrid IMU; and output the compensated signal containing information for the first parameter of the hybrid IMU and the second compensated signal containing information for the second parameter of the hybrid IMU.

Example 8 includes the hybrid IMU of Example 7, wherein the first parameter is a measurement of rotation of the hybrid IMU about a first axis, and wherein the second parameter is a measurement of rotation of the hybrid IMU about a second axis.

Example 9 includes the hybrid IMU of any of Examples 7-8, wherein the first parameter is a measurement of change in speed of the hybrid IMU in a first direction along a first axis, and wherein the second parameter is measurement of the change in speed of the hybrid IMU in a second direction along a second axis.

Example 10 includes the hybrid IMU of any of Examples 1-9, wherein the shock resistant sensor comprises at least one high frequency sensor, wherein the at least one high frequency sensor operates at range of frequencies higher than the at least one low frequency sensor; and wherein the at least one high frequency sensor provides the at least a second signal containing information for the first parameter of the hybrid IMU.

Example 11 includes the hybrid IMU of any of Examples 1-10, wherein the processor further comprises a Kalman filter.

Example 12 includes a method of providing measurements for a hybrid inertial measurement unit (IMU), the method comprising: receiving at least a first signal containing information for a first parameter of the hybrid IMU from a low frequency sensor; receiving at least a second signal containing information for the first parameter of the hybrid IMU from a shock resistant sensor; processing the at least first signal and the at least second signal by: computing a first weight to be applied to the at least the first signal; computing a second weight to be applied to the at least the second signal; applying the first computed weight to the at least the first signal to create a weighted first signal; applying the second computed weight to the at least the second signal to create a weighted second signal; and combining the weighted first signal and the weighted second signal to create a compensated signal containing information for the first parameter of the hybrid IMU; and outputting the compensated signal containing information for the first parameter of the hybrid IMU.

Example 13 includes the method of Example 12, wherein processing the at least first signal and the at least second signal further comprises: monitoring signals provided by the at least one low frequency sensor and the at least one shock resistant sensor to detect a destabilizing operational period that can destabilize one or more of the low frequency sensors and the high frequency sensors; detecting when the destabilizing operational period is in process based on information contained in the at least the first signal and the at least the second signal; when the destabilizing operational period is in process, computing a greater weight to be applied to the at least the second signal than the weight to be applied to the at least the first signal; and when the destabilizing operational period is not in process, computing a greater weight to be applied to the at least the first signal than the weight to be applied to the at least the second signal.

Example 14 includes the method of any of Examples 12-13, wherein processing the at least first signal and the at least second signal further comprises using a Kalman filter.

Example 15 includes the method of any of Examples 12-14, wherein the at least one low frequency sensor is larger is size than the at least one shock resistant sensor.

Example 16 includes the method of any of Examples 12-15, wherein outputting the compensated signal containing information for the first parameter of the hybrid IMU further comprises providing measurement of at least one of rotation of the hybrid IMU about a given axis or change in speed of the IMU in direction along a given axis.

Example 17 includes the method of any of Examples 12-16, wherein the shock resistant sensor comprises at least one high frequency sensor, wherein the at least one high frequency sensor operates at range of frequencies higher than the at least one low frequency sensor.

Example 18 includes a microelectromechanical system (MEMS) hybrid inertial measurement unit (IMU) comprising: a first gyroscope and a second gyroscope to measure rotation of the hybrid IMU about a first axis, wherein the second gyroscope operates at a higher frequency than the first gyroscope; a third gyroscope and a fourth gyroscope to measure rotation of the hybrid IMU about a second axis, wherein the fourth gyroscope operates at a higher frequency than the third gyroscope; a fifth gyroscope and a sixth gyroscope to measure rotation of the hybrid IMU about a third axis, wherein the sixth gyroscope operates at a higher frequency than the fifth gyroscope; and a processor configured to: compute and apply appropriate weights to signals provided by the first gyroscope, the second gyroscope, the third gyroscope, the fourth gyroscope, the fifth gyroscope and the sixth gyroscope to create a weighted first signal, a weighted second signal, a weighted third signal, a weighted fourth signal, a weighted fifth signal and a weighted sixth signal respectively; combine the weighted first signal and the weighted second signal to create a first compensated signal providing measurements for rotation of the hybrid IMU about a first axis; combine the weighted third signal and the weighted fourth signal to create a second compensated signal providing measurements for rotation of the hybrid IMU about a second axis; combine the weighted fifth signal and the weighted sixth signal to create a third compensated signal providing measurements for rotation of the hybrid IMU about a third axis; and output the first compensated signal, the second compensated signal and the third compensated signal.

Example 19 includes the MEMS IMU of Example 18, further comprising: a first accelerometer and a second accelerometer to measure change in speed of the hybrid IMU in a direction along a first axis; a third accelerometer and a fourth accelerometer to measure change in speed of the hybrid IMU in a direction along a second axis; a fifth accelerometer and a sixth accelerometer to measure change in speed of the hybrid IMU in a direction along a third axis; and wherein the processor is further configured to: compute and apply appropriate weights to signals provided by the first accelerometer, the second accelerometer, the third accelerometer, the fourth accelerometer, the fifth accelerometer and the sixth accelerometer to create a weighted first accelerometer signal, a weighted second accelerometer signal, a weighted third accelerometer signal, a weighted fourth accelerometer signal, a weighted fifth accelerometer signal and a weighted sixth accelerometer signal respectively; combine the weighted first accelerometer signal and the weighted second accelerometer signal to create a fourth compensated signal providing measurements for change of speed of the hybrid IMU in a direction along the first axis; combine the weighted third accelerometer signal and the weighted fourth accelerometer signal to create a fifth compensated signal providing measurements for change of speed of the hybrid IMU in a direction along the second axis; combine the weighted fifth accelerometer signal and the weighted sixth accelerometer signal to create a sixth compensated signal providing measurements for change of speed of the hybrid IMU in a direction along the third axis; and output the fourth compensated signal, the fifth compensated signal and the sixth compensated signal.

Example 20 includes the MEMS IMU of any of Examples 18-19, wherein the processor is further configured to: monitor signals provided by the first gyroscope, the second gyroscope, the third gyroscope, the fourth gyroscope, the fifth gyroscope and the sixth gyroscope; and determine when a destabilizing operational period is in process based on information contained in the signals provided by the first gyroscope, the second gyroscope, the third gyroscope, the fourth gyroscope, the fifth gyroscope and the sixth gyroscope to compute appropriate weights to be applied to the signals provided by the first gyroscope, the second gyroscope, the third gyroscope, the fourth gyroscope, the fifth gyroscope and the sixth gyroscope.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A hybrid inertial measurement unit (IMU), the hybrid IMU comprising:
   at least one low frequency sensor providing at least a first signal containing information for a first parameter of the hybrid IMU;
   at least one shock resistant sensor providing at least a second signal containing information for the first parameter of the hybrid IMU, wherein the at least one shock resistant sensor is resistant to destabilization during a destabilizing operational period, and wherein the at least one shock resistant sensor operates at a higher frequency than the at least one low frequency sensor; and
   at least one processor, wherein the at least one processor further comprises:
      a weighting factor computation module to compute a weight to be applied to the at least the first signal and to compute a weight to be applied to the at least the second signal;
      a low frequency weighting module to apply the computed weight to the at least the first signal to create a weighted first signal;
      a shock resistant weighting module to apply the computed weight to the at least the second signal to create a weighted second signal; and
      a compensating module to combine the weighted first signal and the weighted second signal to create a compensated signal containing information for the first parameter of the hybrid IMU, and to output the compensated signal containing information for the first parameter of the hybrid IMU;
   and wherein the compensated signal provides an improved measurement of the first parameter of the hybrid IMU over measurements provided by the first signal and the second signal during the destabilizing operational period.

2. The hybrid IMU of claim 1, wherein the processor is further configured to:
   monitor signals provided by the at least one low frequency sensor and the at least one shock resistant sensor to detect a destabilizing operational period, wherein during the destabilizing operational period one or more of the at least one low frequency sensors are destabilized;
   determine when a destabilizing operational period is in process based on information contained in the at least the first signal and the at least the second signal;
   when the destabilizing operational period is in process, compute a greater weight to be applied to the at least the second signal than the weight to be applied to the at least the first signal; and
   when the destabilizing operational period is not in process, compute a greater weight to be applied to the at least the first signal than the weight to be applied to the at least the second signal.

3. The hybrid IMU of claim 1, wherein the destabilizing operational period is at least one of a given time duration after start-up of the hybrid IMU or shock or vibration event.

4. The hybrid IMU of claim 1, wherein the low frequency sensors are larger in size than the shock resistant sensors.

5. The hybrid IMU of claim 1, wherein the at least one low frequency sensor includes at least one of a gyroscope, an accelerometer or a magnetometer, and wherein the at least one shock resistant sensor includes at least one of a gyroscope, an accelerometer or a magnetometer.

6. The hybrid IMU of claim 1, wherein the first parameter is measurement of at least one of the rotation of the hybrid IMU about a given axis or the change in speed of the hybrid IMU in a direction along a given axis.

7. The hybrid IMU of claim 1, further comprising:
   a second low frequency sensor providing at least a third signal containing information for a second parameter of the hybrid IMU;
   a second shock resistant sensor providing at least a fourth signal containing information for the second parameter of the hybrid IMU; and
   wherein the processor is further configured to:
      compute a weight to be applied to the at least the third signal;
      compute a weight to be applied to the at least the fourth signal;
      apply the computed weight to the at least the third signal to create a weighted third signal;
      apply the computed weight to the at least the fourth signal to create a weighted fourth signal;
      combine the weighted third signal and the weighted fourth signal to create a second compensated signal containing information for the second parameter of the hybrid IMU; and
      output the compensated signal containing information for the first parameter of the hybrid IMU and the second compensated signal containing information for the second parameter of the hybrid IMU.

8. The hybrid IMU of claim 7, wherein the first parameter is a measurement of rotation of the hybrid IMU about a first axis, and wherein the second parameter is a measurement of rotation of the hybrid IMU about a second axis.

9. The hybrid IMU of claim 7, wherein the first parameter is a measurement of change in speed of the hybrid IMU in a first direction along a first axis, and wherein the second parameter is measurement of the change in speed of the hybrid IMU in a second direction along a second axis.

10. The hybrid IMU of claim 1, wherein the shock resistant sensor comprises at least one high frequency sensor, wherein the at least one high frequency sensor operates at range of frequencies higher than the at least one low frequency sensor; and wherein the at least one high frequency sensor provides the at least a second signal containing information for the first parameter of the hybrid IMU.

11. The hybrid IMU of claim 1, wherein the processor further comprises a Kalman filter.

12. A method of providing measurements for a hybrid inertial measurement unit (IMU), the method comprising:
measuring a first parameter of the hybrid IMU using at least a first signal from a low frequency sensor;
measuring the first parameter of the hybrid IMU using at least a second signal from a shock resistant sensor, wherein the at least one shock resistant sensor operates at a higher frequency than the at least one low frequency sensor;
processing the at least first signal and the at least second signal by:
computing a first weight to be applied to the at least the first signal;
computing a second weight to be applied to the at least the second signal;
applying the first computed weight to the at least the first signal to create a weighted first signal;
applying the second computed weight to the at least the second signal to create a weighted second signal; and
combining the weighted first signal and the weighted second signal to create a compensated signal containing information for the first parameter of the hybrid IMU; and
outputting the compensated signal containing information for the first parameter of the hybrid IMU, wherein the compensated signal provides an improved measurement of the first parameter of the hybrid IMU over measurements provided by the first signal and the second signal during the destabilizing operational period.

13. The method of claim 12, wherein processing the at least first signal and the at least second signal further comprises:
monitoring signals provided by the at least one low frequency sensor and the at least one shock resistant sensor to detect a destabilizing operational period that can destabilize one or more of the low frequency sensors and the high frequency sensors;
detecting when the destabilizing operational period is in process based on information contained in the at least the first signal and the at least the second signal;
when the destabilizing operational period is in process, computing a greater weight to be applied to the at least the second signal than the weight to be applied to the at least the first signal; and
when the destabilizing operational period is not in process, computing a greater weight to be applied to the at least the first signal than the weight to be applied to the at least the second signal.

14. The method of claim 12, wherein processing the at least first signal and the at least second signal further comprises using a Kalman filter.

15. The method of claim 12, wherein the at least one low frequency sensor is larger is size than the at least one shock resistant sensor.

16. The method of claim 12, wherein outputting the compensated signal containing information for the first parameter of the hybrid IMU further comprises providing measurement of at least one of rotation of the hybrid IMU about a given axis or change in speed of the IMU in a direction along a given axis.

17. The method of claim 12, wherein the shock resistant sensor comprises at least one high frequency sensor, wherein the at least one high frequency sensor operates at range of frequencies higher than the at least one low frequency sensor.

18. A microelectromechanical system (MEMS) hybrid inertial measurement unit (IMU) comprising:
a first gyroscope and a second gyroscope to measure rotation of the hybrid IMU about a first axis, wherein the second gyroscope operates at a higher frequency than the first gyroscope;
a third gyroscope and a fourth gyroscope to measure rotation of the hybrid IMU about a second axis, wherein the fourth gyroscope operates at a higher frequency than the third gyroscope;
a fifth gyroscope and a sixth gyroscope to measure rotation of the hybrid IMU about a third axis, wherein the sixth gyroscope operates at a higher frequency than the fifth gyroscope; and
a processor configured to:
compute and apply appropriate weights to signals provided by the first gyroscope, the second gyroscope, the third gyroscope, the fourth gyroscope, the fifth gyroscope and the sixth gyroscope to create a weighted first signal, a weighted second signal, a weighted third signal, a weighted fourth signal, a weighted fifth signal and a weighted sixth signal respectively;
combine the weighted first signal and the weighted second signal to create a first compensated signal providing measurements for rotation of the hybrid IMU about a first axis;
combine the weighted third signal and the weighted fourth signal to create a second compensated signal providing measurements for rotation of the hybrid IMU about a second axis;
combine the weighted fifth signal and the weighted sixth signal to create a third compensated signal providing measurements for rotation of the hybrid IMU about a third axis; and
output the first compensated signal, the second compensated signal and the third compensated signal, wherein the first compensated signal provides improved measurement for rotation of the hybrid IMU about the first axis during a destabilization period, wherein the second compensated signal provides improved measurement for rotation of the hybrid IMU about the second axis during the destabilization period, and wherein the third compensated signal provides improved measurement for rotation of the hybrid IMU about the third axis during the destabilizing operational period.

19. The MEMS IMU of claim 18, further comprising:
a first accelerometer and a second accelerometer to measure change in speed of the hybrid IMU in a direction along a first axis;

a third accelerometer and a fourth accelerometer to measure change in speed of the hybrid IMU in a direction along a second axis;

a fifth accelerometer and a sixth accelerometer to measure change in speed of the hybrid IMU in a direction along a third axis; and wherein the processor is further configured to:
compute and apply appropriate weights to signals provided by the first accelerometer, the second accelerometer, the third accelerometer, the fourth accelerometer, the fifth accelerometer and the sixth accelerometer to create a weighted first accelerometer signal, a weighted second accelerometer signal, a weighted third accelerometer signal, a weighted fourth accelerometer signal, a weighted fifth accelerometer signal and a weighted sixth accelerometer signal respectively;

combine the weighted first accelerometer signal and the weighted second accelerometer signal to create a fourth compensated signal providing measurements for change of speed of the hybrid IMU in the direction along the first axis;

combine the weighted third accelerometer signal and the weighted fourth accelerometer signal to create a fifth compensated signal providing measurements for change of speed of the hybrid IMU in the direction along the second axis;

combine the weighted fifth accelerometer signal and the weighted sixth accelerometer signal to create a sixth compensated signal providing measurements for change of speed of the hybrid IMU in the direction along the third axis; and output the fourth compensated signal, the fifth compensated signal and the sixth compensated signal.

20. The MEMS IMU of claim 18, wherein the processor is further configured to:

monitor signals provided by the first gyroscope, the second gyroscope, the third gyroscope, the fourth gyroscope, the fifth gyroscope and the sixth gyroscope; and determine when a destabilizing operational period is in process based on information contained in the signals provided by the first gyroscope, the second gyroscope, the third gyroscope, the fourth gyroscope, the fifth gyroscope and the sixth gyroscope to compute appropriate weights to be applied to the signals provided by the first gyroscope, the second gyroscope, the third gyroscope, the fourth gyroscope, the fifth gyroscope and the sixth gyroscope.

* * * * *